(12) United States Patent
Tsuruoka et al.

(10) Patent No.: US 11,153,471 B2
(45) Date of Patent: Oct. 19, 2021

(54) THROUGH-HOLE ELECTRODE SUBSTRATE

(71) Applicant: DAI NIPPON PRINTING Co., Ltd., Tokyo (JP)

(72) Inventors: Yoshiaki Tsuruoka, Tokyo (JP); Masaaki Asano, Tokyo (JP); Shinji Maekawa, Tokyo (JP)

(73) Assignee: DAI NIPPON PRINTING Co., Ltd., Tokyo (JP)

( * ) Notice: Subject to any disclaimer, the term of this patent is extended or adjusted under 35 U.S.C. 154(b) by 0 days.

(21) Appl. No.: 16/861,342

(22) Filed: Apr. 29, 2020

(65) Prior Publication Data

US 2020/0259980 A1    Aug. 13, 2020

Related U.S. Application Data

(63) Continuation of application No. 15/892,464, filed on Feb. 9, 2018, now Pat. No. 10,681,256, which is a
(Continued)

(30) Foreign Application Priority Data

Aug. 10, 2015  (JP) ................................. 2015-158164
May 20, 2016  (JP) ................................. 2016-101074

(51) Int. Cl.
*H04N 5/225*    (2006.01)
*H01L 27/146*   (2006.01)
(Continued)

(52) U.S. Cl.
CPC ............. *H04N 5/2257* (2013.01); *G02B 7/08* (2013.01); *H01L 27/1462* (2013.01);
(Continued)

(58) Field of Classification Search
CPC ...... H04N 5/2257; H04N 5/2254; G02B 7/08; G02B 13/16; G02B 5/208; G02B 7/021;
(Continued)

(56) References Cited

U.S. PATENT DOCUMENTS 7,701,044 B2 *  4/2010  Kang ................ H01L 27/14683
                                                       257/680
7,948,555 B2    5/2011  Kwon et al.
(Continued)

FOREIGN PATENT DOCUMENTS

JP    2004-063786 A    2/2004
JP    2004-079745 A    3/2004
(Continued)

OTHER PUBLICATIONS

Japanese Office Action dated Mar. 3, 2020 for the corresponding Japanese Patent Application No. 2018-174906, with partial English Machine translation.
(Continued)

*Primary Examiner* — Luong T Nguyen
(74) *Attorney, Agent, or Firm* — Michael Best & Friedrich LLP

(57) ABSTRACT

An image sensor module includes an interposer substrate having a first surface and a second surface opposite to the first surface, the interposer substrate being light-transmissive and having a plurality of through-holes; an image sensor located to face the first surface of the interposer substrate, the image sensor having a light receiving surface on a side of the interposer substrate, a plurality of photoelectric conversion elements being located at the light receiving surface, the image sensor being connected with an external circuit via electrodes provided in the plurality of through-holes; and a lens unit located to face the second surface of the interposer substrate.

16 Claims, 30 Drawing Sheets

Related U.S. Application Data continuation of application No. PCT/JP2016/072521, filed on Aug. 1, 2016.

(51) Int. Cl.
*H01L 31/0224* (2006.01)
*G02B 7/08* (2021.01)
G02B 7/02 (2021.01)
G02B 13/16 (2006.01)
G02B 5/20 (2006.01)

(52) U.S. Cl.
CPC .......... *H01L 27/14627* (2013.01); *H01L 31/022408* (2013.01); *H04N 5/2254* (2013.01); *G02B 5/208* (2013.01); *G02B 7/021* (2013.01); *G02B 13/16* (2013.01); *H01L 27/14621* (2013.01); *H01L 27/14636* (2013.01)

(58) Field of Classification Search
CPC ....... H01L 27/14627; H01L 31/022408; H01L 27/1462; H01L 27/14636; H01L 27/14621
See application file for complete search history.

(56) References Cited

U.S. PATENT DOCUMENTS

| | | | | |
|---|---|---|---|---|
| 2006/0096781 | A1* | 5/2006 | Yamano | H05K 3/007 174/264 |
| 2007/0029582 | A1* | 2/2007 | Minamio | H01L 27/14618 257/234 |
| 2007/0252227 | A1 | 11/2007 | Fukuda et al. | |
| 2009/0096051 | A1 | 4/2009 | Sugiyama et al. | |
| 2009/0121344 | A1 | 5/2009 | Sunohara | |
| 2010/0148294 | A1 | 6/2010 | Fujii et al. | |
| 2010/0231766 | A1 | 9/2010 | Moriya et al. | |
| 2010/0321544 | A1 | 12/2010 | Matsuo et al. | |
| 2011/0043686 | A1 | 2/2011 | Chang | |
| 2011/0141346 | A1 | 6/2011 | Ryu | |
| 2011/0220970 | A1 | 9/2011 | Komatsu et al. | |
| 2011/0266587 | A1 | 11/2011 | Naruse et al. | |
| 2012/0056292 | A1 | 3/2012 | Suzuki et al. | |
| 2012/0163020 | A1* | 6/2012 | Inada | G02B 6/006 362/606 |
| 2012/0248553 | A1 | 10/2012 | Takano | |
| 2012/0257075 | A1 | 10/2012 | Kamada | |
| 2013/0119501 | A1 | 5/2013 | Yoshida | |
| 2013/0120734 | A1 | 5/2013 | Ogata et al. | |
| 2013/0329337 | A1 | 12/2013 | Masuda et al. | |
| 2014/0008749 | A1 | 1/2014 | Nomura et al. | |
| 2015/0085369 | A1 | 3/2015 | Tazawa et al. | |

FOREIGN PATENT DOCUMENTS

| | | |
|---|---|---|
| JP | 2007-042879 A | 2/2007 |
| JP | 2007-299929 A | 11/2007 |
| JP | 2008-041801 A | 2/2008 |
| JP | 2008-177708 A | 7/2008 |
| JP | 2008-191267 A | 8/2008 |
| JP | 2009-099591 A | 5/2009 |
| JP | 2009-267151 A | 11/2009 |
| JP | 2009-283902 A | 12/2009 |
| JP | 2010-034668 A | 2/2010 |
| JP | 2010-045082 A | 2/2010 |
| JP | 2010-165804 A | 7/2010 |
| JP | 2010-213034 A | 9/2010 |
| JP | 2010-232396 A | 10/2010 |
| JP | 2010-252164 A | 11/2010 |
| JP | 2011-003863 A | 1/2011 |
| JP | 2011-119481 A | 6/2011 |
| JP | 2011-123497 A | 6/2011 |
| JP | 2011-187754 A | 9/2011 |
| JP | 2011-198862 A | 10/2011 |
| JP | 2011-205068 A | 10/2011 |
| JP | 2012-015470 A | 1/2012 |
| JP | 2012-059832 A | 3/2012 |
| JP | 2012-222546 A | 11/2012 |
| JP | 2013-041922 A | 2/2013 |
| JP | 2013-118206 A | 6/2013 |
| JP | 2013-153361 A | 8/2013 |
| JP | 2014-093632 A | 5/2014 |
| JP | 2015-068853 A | 4/2015 |
| WO | 2011/118116 A1 | 9/2011 |
| WO | 2015/076309 A1 | 5/2015 |

OTHER PUBLICATIONS

Japanese Notice of Allowance dated Aug. 21, 2018 for the corresponding Japanese Patent Application No. 2017-153487, with partial English translation.
International Search Report dated Oct. 25, 2016 for the corresponding International Application No. PCT/JP2016/072521 (WO2017/026317), with English Machine translation.
Written Opinion of the International Searching Authority dated Oct. 25, 2016 for the corresponding International Application No. PCT/JP2016/072521 (WO2017/026317), with English Machine translation.
Japanese Office Action dated Apr. 11, 2017 for the corresponding Japanese Patent Application No. 2016-101074, with English Machine translation.
Japanese Office Action dated May 30, 2017 for the corresponding Japanese Patent Application No. 2016-101074, with English Machine translation.
Japanese Office Action dated Nov. 14, 2017 for the corresponding Japanese Patent Application No. 2017-153487, with English Machine translation.
Japanese Office Action dated Apr. 10, 2018 for the corresponding Japanese Patent Application No. 2017-153487, with English Machine translation.

* cited by examiner

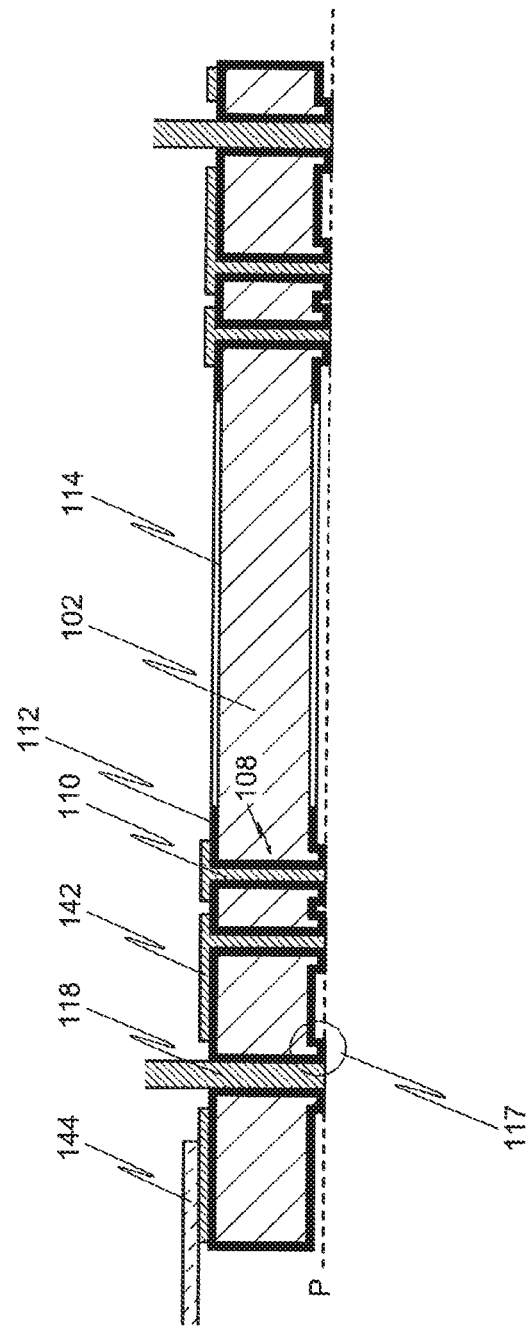

1000

2000

3000

6000

THROUGH-HOLE ELECTRODE SUBSTRATE

CROSS REFERENCE TO RELATED APPLICATIONS

This application is a continuation of U.S. patent application Ser. No. 15/892,464 filed on Feb. 9, 2018. Further, this application is a U.S. continuation application filed under 35 U.S.C. § 111(a), of International Application No. PCT/JP2016/072521, filed on Aug. 1, 2016, which claims priority from Japanese Patent Application No. 2015-158164 filed on Aug. 10, 2015 and Japanese Patent Application No. 2016-101074, filed on May 20, 2016, the entire contents of which are incorporated by reference into this application.

FIELD

The present disclosure relates to an image sensor module, and specifically, an image sensor module, using a solid-state imaging element, that may be built in a mobile electronic device or a tablet terminal.

BACKGROUND

As an image sensor to be built in a mobile electronic device or a tablet terminal, a solid-state imaging element is widely known. Such a solid-state imaging element has a light receiving surface on which pixels, each including a semiconductor chip or the like and a photoelectric conversion element provided thereon, are arrayed. An image of light provided from an imaging target is formed at the light receiving surface by an optical system such as a lens or the like, and the light of the image is converted into an amount of charges in accordance with the brightness thereof to provide an electric signal. Thus, an output image is provided.

Recently, mobile electronic devices have been progressively reduced in size and improved in quality and functionality. Therefore, a solid-state imaging device mountable on such an electronic device is also desired to be more compact and higher in quality and functionality.

For example, Japanese Laid-Open Patent Publication No. 2012-222546 discloses a solid-state imaging device including a solid-state imaging element mounted on a substrate, a bonding wire electrically connecting a pad provided on the solid-state imaging element and a lead provided on the substrate to each other, a frame member surrounding sides of the solid-state imaging element, and a light-transmissive optical member attached to the frame member while facing an imaging surface of the solid-state imaging element. The frame member includes a leg extending from the optical member side toward the imaging surface. In the state where an end of the bonding wire connected with the pad is covered with the leg, the frame member and the solid-state imaging element are integrally secured to each other.

In order to form an image of the imaging target at the same focal plane on the entirety of the light receiving surface of the solid-state imaging element, it is necessary that an optical axis of a lens group included in a lens unit and normal to the solid-state imaging element match each other. In the above-described structure, one same substrate is used as a reference surface on which the lens unit is attached and as a reference surface on which the solid-state imaging element is attached. However, the flatness of the substrate is not described. In the case where, for example, a glass epoxy substrate is used as the substrate, a complicated process is required to assemble the lens unit and the solid-state imaging element in consideration of the flatness of the surface of the substrate. The complicated process includes making the light receiving surface of a semiconductor chip, which is the solid-state imaging element to be bonded and thus secured to the substrate, parallel with high precision, and making the optical axis of the lens unit perpendicular, with high precision, to the surface of the substrate for securing the lens unit. Due to such a complicated process, the optical axis of the lens group included in the lens unit and the normal to the solid-state imaging element may be undesirably shifted from each other.

SUMMARY

An image sensor module in an embodiment according to the present disclosure includes an interposer substrate having a first surface and a second surface opposite to the first surface, the interposer substrate being light-transmissive and having a plurality of through-holes; an image sensor located to face the first surface of the interposer substrate, the image sensor having a light receiving surface on a side of the interposer substrate, a plurality of photoelectric conversion elements being located at the light receiving surface, the image sensor being connected with an external circuit via electrodes provided in the plurality of through-holes; and a lens unit located to face the second surface of the interposer substrate.

The lens unit includes three or more support columns, and at least three of the three or more support columns are inserted into the plurality of through-holes.

The lens unit includes an imaging lens group; a first case accommodating the imaging lens group; and a second case joined with the first case via a plurality of springs, and the second case includes the at least three of the three or more support columns.

The first case includes a coil surrounding the first case; and at least two support columns of the three or more support columns, the at least two support columns being conductive and connected with the coil.

The image sensor module further includes a conformal conductor provided in each of the plurality of through-holes.

The image sensor module further includes a permanent magnet provided outer to the second case so as to surround the coil.

The lens unit is detachable.

The image sensor module further includes a light absorption layer on the first surface, a side surface of the interposer substrate, a side wall of each of the plurality of through-holes, and a region of the image sensor other than the light receiving surface.

The light absorption layer is formed of a metal material.

The light absorption layer is formed of a black resin.

The image sensor module further includes a reflection preventive layer on a region of each of the first surface and the second surface, the region facing the light receiving surface of the image sensor.

The reflection preventive layer is a sheet having a structure including protrusions.

The electrodes provided in the plurality of through-holes fill the plurality of through-holes.

The electrodes provided in the plurality of through-holes each have a cavity inside the electrode.

The image sensor module further includes an insulating material filling the cavity.

The insulating material is a resin.

Ends, on the side of the first surface, of the electrodes provided in the plurality of through-holes are located on the side of the image sensor with respect to the first surface.

The ends, on the side of the first surface, of the electrodes provided in the plurality of through-holes are located on the same plane parallel to the second surface.

The interposer substrate includes a protruding portion on the first surface side, the protruding portion surrounding the side wall of each of the plurality of through-holes.

The image sensor module further includes a heat releasing member secured to a surface of the image sensor opposite to the light receiving surface.

BRIEF DESCRIPTION OF DRAWINGS

FIG. 15 is a cross-sectional view showing an interposer substrate and the vicinity thereof in the image sensor module in an embodiment according to the present disclosure;

DESCRIPTION OF EMBODIMENTS

Figure 1:
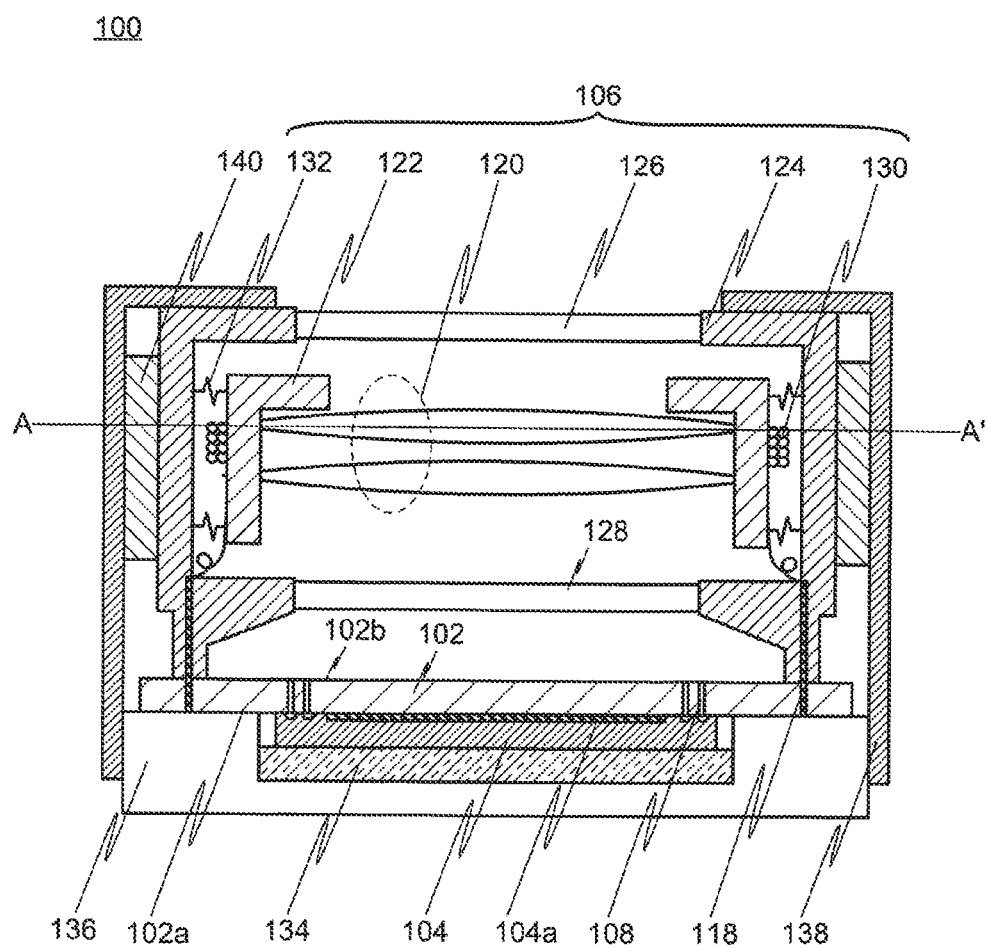
FIG. 1 is a cross-sectional view showing a general structure of an image sensor module in an embodiment according to the present disclosure.

Hereinafter, structures and production methods of image sensor modules in embodiments of the present disclosure will be described with reference to the drawings. The following embodiments are merely examples of the present disclosure, and the present disclosure is not to be construed as being limited to these embodiments. In the drawings referred to in the embodiments, the same components or the components having substantially the same functions bear the identical reference signs, and the descriptions thereof may not be repeated. In the drawings, the ratio of sizes may be different from the actual ratio of sizes for the sake of illustration, or the components may be partially omitted.

In light of the above-described situation, the present disclosure has an object of providing a structure of an image sensor module allowing an optical system to be assembled easily and highly precisely.

Embodiment 1

[General Structure of the Image Sensor Module 100]

Figure 2:
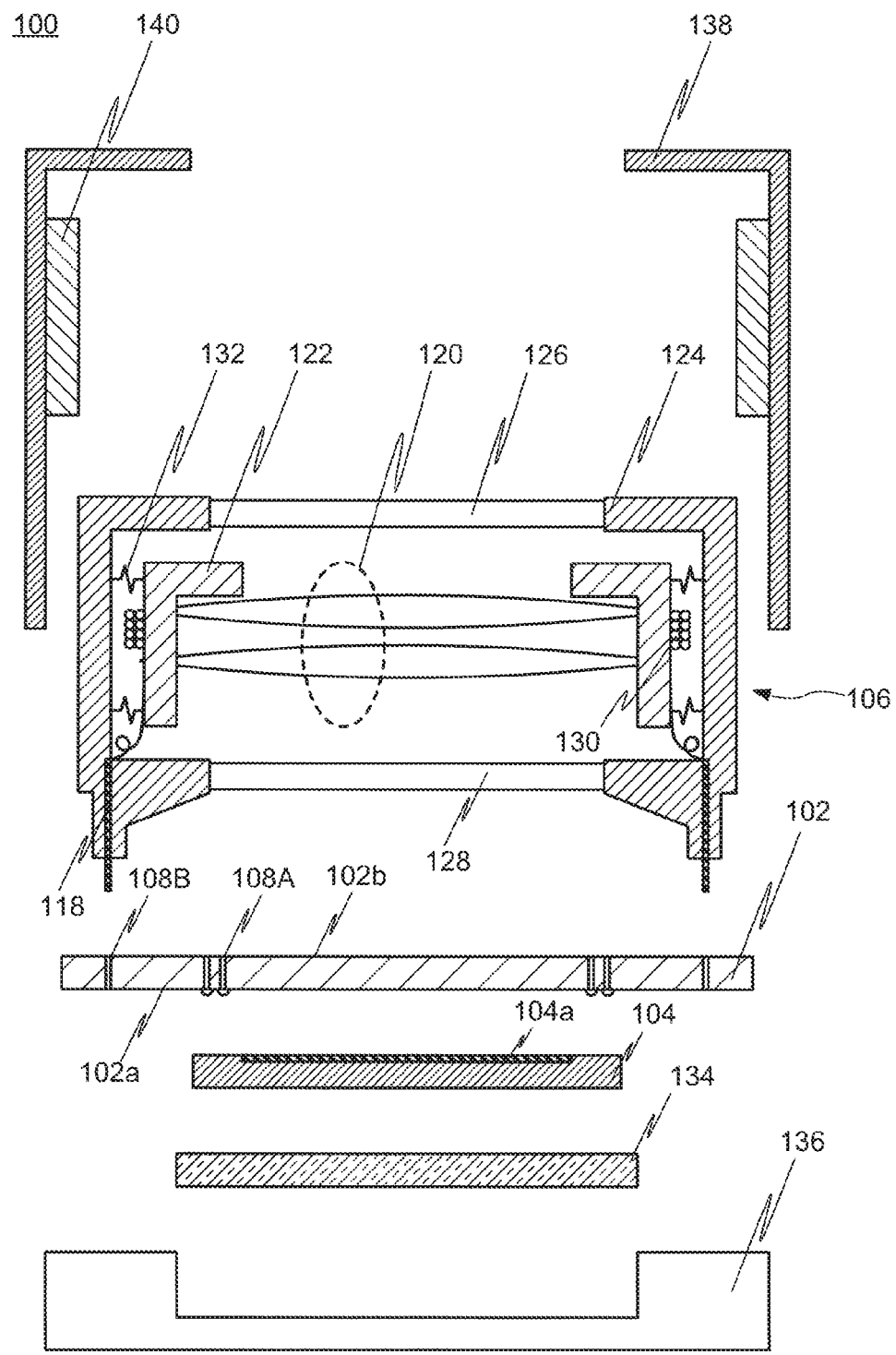
FIG. 2 is an exploded cross-sectional view showing the general structure of the image sensor module in an embodiment according to the present disclosure.
Figure 3:
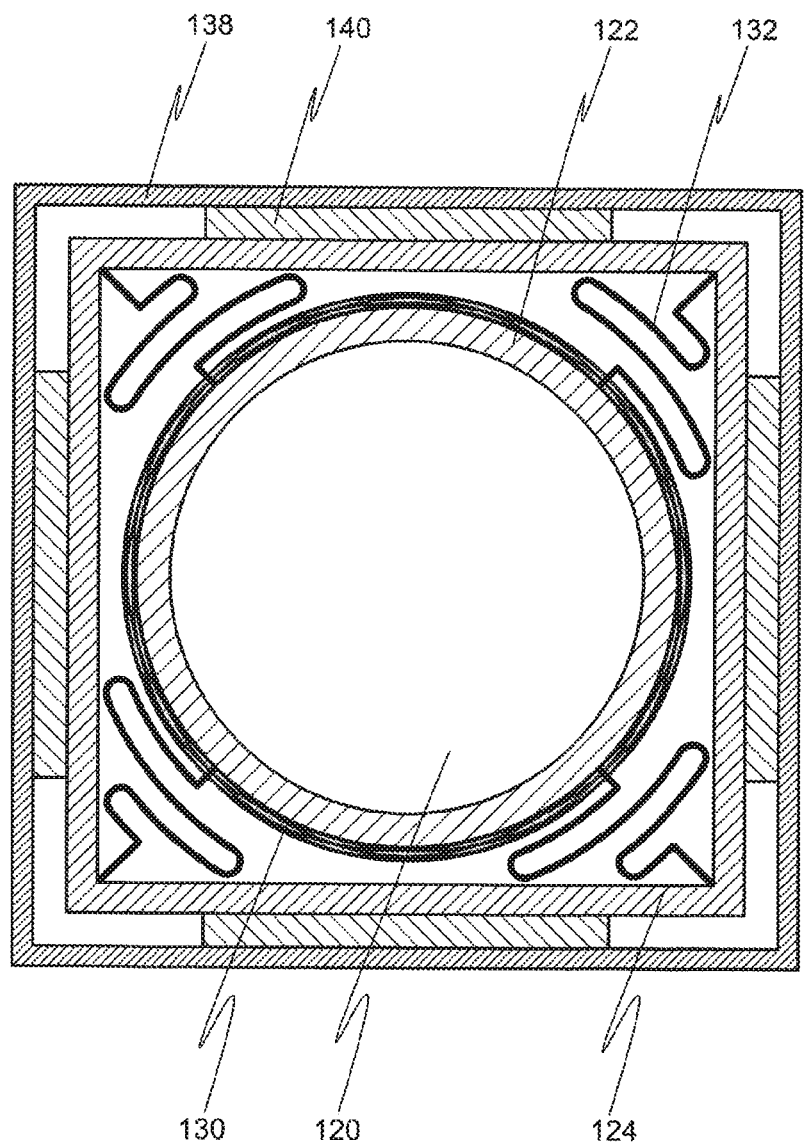
FIG. 3 is a cross-sectional view showing the general structure of the image sensor module in an embodiment according to the present disclosure.

With reference to FIG. 1 to FIG. 5, a general structure of an image sensor module 100 in this embodiment will be described in detail. FIG. 1 is a cross-sectional view showing the general structure of the image sensor module 100 in this embodiment. FIG. 2 is an exploded cross-sectional view showing the general structure of the image sensor module 100 in this embodiment. FIG. 3 is a cross-sectional view showing the general structure of the image sensor module 100 in this embodiment. FIG. 1 and FIG. 2 each show a cross-sectional view taken along a plane including an optical axis of the image sensor module 100. FIG. 3 shows a cross-sectional view taken along a plane that includes line A-A' in FIG. 1 and is perpendicular to the optical axis of the image sensor module 100.

The image sensor module 100 in this embodiment includes an interposer substrate 102, an image sensor 104, a lens unit 106, a heat releasing member 134, a third case 136, permanent magnets 140, and a cover 138.

The interposer substrate 102 has a first surface 102*a* and a second surface 102*b*. The second surface 102*b* is opposite to the first surface 102*a*. A structure of the interposer substrate 102 in this embodiment will be described in detail with reference to the drawings.

Figure 4:
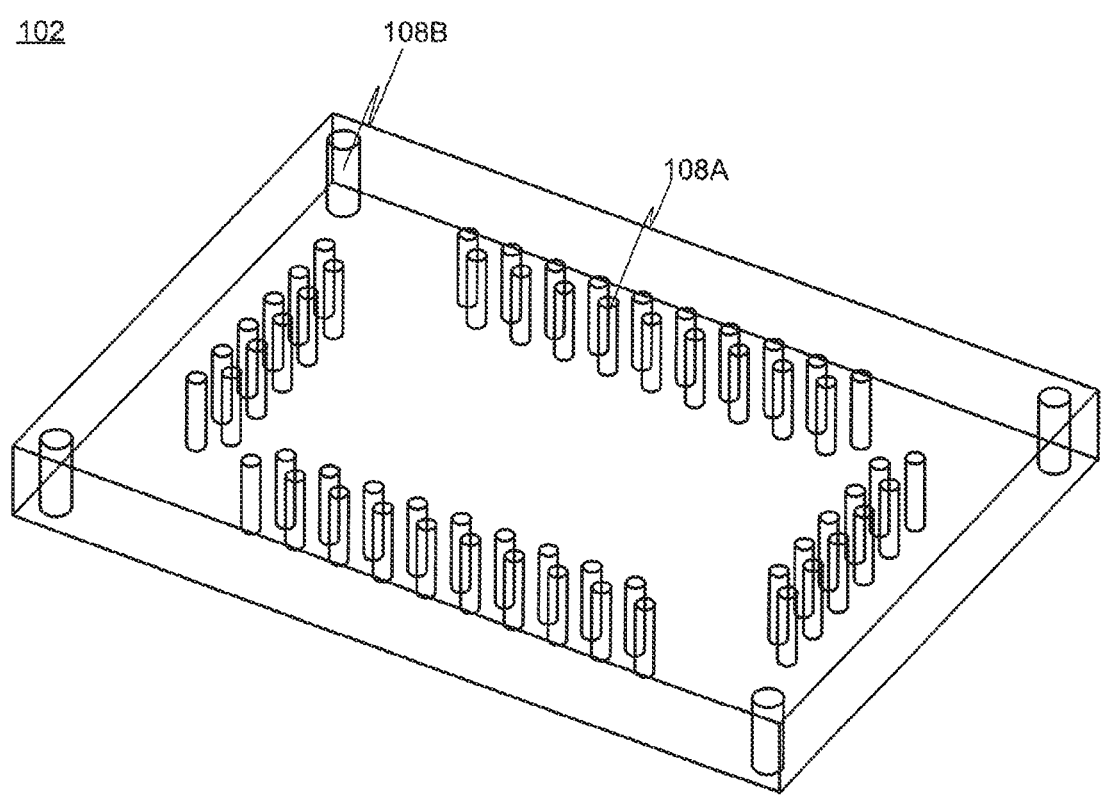
FIG. 4 is a perspective view showing a structure of an interposer substrate in an embodiment according to the present disclosure.
Figure 5:
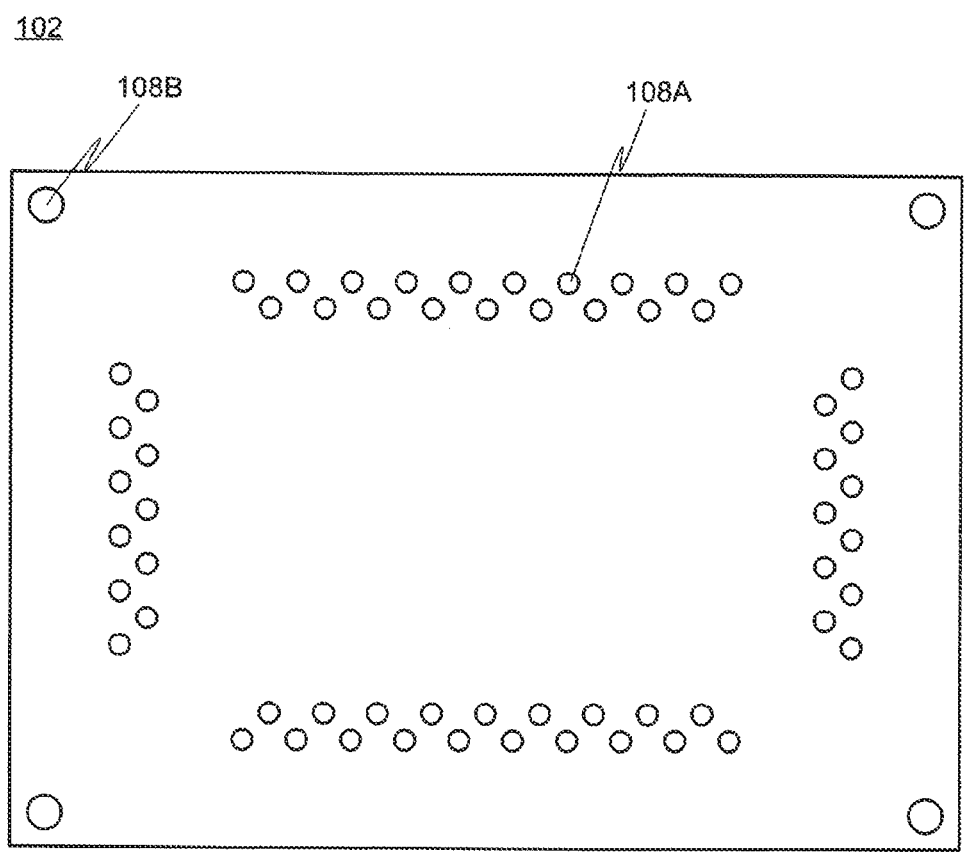
FIG. 5 is a plan view showing the structure of the interposer substrate in an embodiment according to the present disclosure.

FIG. 4 is a perspective view showing the structure of the interposer substrate 102 in this embodiment. FIG. 5 is a plan view showing the structure of the interposer substrate 102 in this embodiment.

The interposer substrate 102 has a plurality of through-holes 108 provided therein. The plurality of through-holes 108 include through-holes 108 provided for different purposes from each other. In this embodiment, the plurality of through-holes 108 are classified into two types. In the following description, such through-holes 108 may be referred to as "first through-holes 108A" or "second through-holes 108B" for distinguishing the two types of the through-holes 108 from each other. As described below in detail, the plurality of first through-holes 108A are each provided in order to have an electrode be formed therein. The electrode electrically connects the image sensor 104 and an external circuit (not shown) to each other. The second through-holes 108B are each provided in order to have a support column 118 be inserted thereinto. The support column 118 allows the lens unit 106 to be located on the second surface 102*b* side.

In this embodiment, the plurality of first through-holes 108A are roughly located along four sides of the interposer substrate 102, which has a rectangular shape. Nineteen first through-holes 108A are located along each of two longer sides of the rectangular shape facing each other, and 11 first through-holes 108A are located along each of two shorter sides of the rectangular shape facing each other. Along each of the sides, the plurality of first through-holes 108A are located in two lines. The plurality of first through-holes 108A are located in a zigzag.

The number, layout and the like of the plurality of first through-holes 108A are not limited to the above. The number of the plurality of first through-holes 108A may be any number larger than, or equal to, the number required to form a wire connecting the image sensor module 100 and an external circuit to each other. The plurality of first through-holes 108A may be laid out in any manner in a plan view as long as the plurality of first through-holes 108A do not overlap a plurality of photoelectric conversion elements located at a light receiving surface 104*a* of the image sensor 104.

Four second through-holes 108B are provided in this embodiment. The four second through-holes 108B are respectively located in the vicinity of four corners of the interposer substrate 102. The second through-holes 108B each have a diameter larger than a diameter of each of the first through-holes 108A.

The number, layout and the like of the plurality of second through-holes 108B are not limited to the above. As described below in detail, the number of the second through-holes 108B may be three or larger. The plurality of second through-holes 108B may be laid out in any manner in a plan view as long as the plurality of second through-holes 108B are not located on one straight line and do not overlap the plurality of photoelectric conversion elements located at the light receiving surface 104*a* of the image sensor 104. The second through-holes 108B may each have any diameter that is sufficient to allow the support column 118 to be inserted thereinto. The support columns 118 need to be sufficiently strong to locate the lens unit 106 stably on the second surface 102*b* of the interposer substrate 102, and therefore, each need to have a sufficiently large diameter.

The interposer substrate 102 is a light-transmissive substrate in order to allow light reflected by the imaging target to be incident on the light receiving surface 104*a* of the image sensor 104, which is located below the interposer substrate 102.

Each of the two surfaces of the interposer substrate 102 also acts as a reference surface based on which an optical system including the lens unit 106, the image sensor 104 and the like is to be assembled. It is preferred that normal to the light receiving surface 104*a* of the image sensor 104 and the optical axis of an imaging lens group 120 included in the lens unit 106 match each other highly precisely. Therefore, it is desired that a substrate having two surfaces that are highly flat and highly parallel to each other is used as the interposer substrate 102.

Such a substrate may be, for example, a glass substrate. The glass substrate may be formed of, for example, quartz glass, non-alkaline glass, borosilicate glass, aluminosilicate glass, soda-lime glass, titanium-containing silicate glass or the like. Examples of the substrate other than the glass substrate include a sapphire substrate, a silicon carbide (SiC) substrate, an alumina ($Al_2O_3$) substrate, an aluminum nitride (AlN) substrate, a zirconium oxide ($ZrO_2$) substrate, and the like. Alternatively, some of these substrates may be combined to form a stack substrate.

The image sensor 104 is located to face the first surface 102*a* of the interposer substrate 102. The image sensor 104 is connected with an external circuit (not shown) via the electrode in each of the plurality of first through-holes 108A. The image sensor 104 has the light receiving surface 104*a* on the interposer substrate 102 side. At the light receiving surface 104*a*, a plurality of photoelectric conversion elements are located in, for example, a matrix. The photoelectric conversion elements may be, for example, CMOS image sensors, CCD image sensors or the like.

Figure 6:
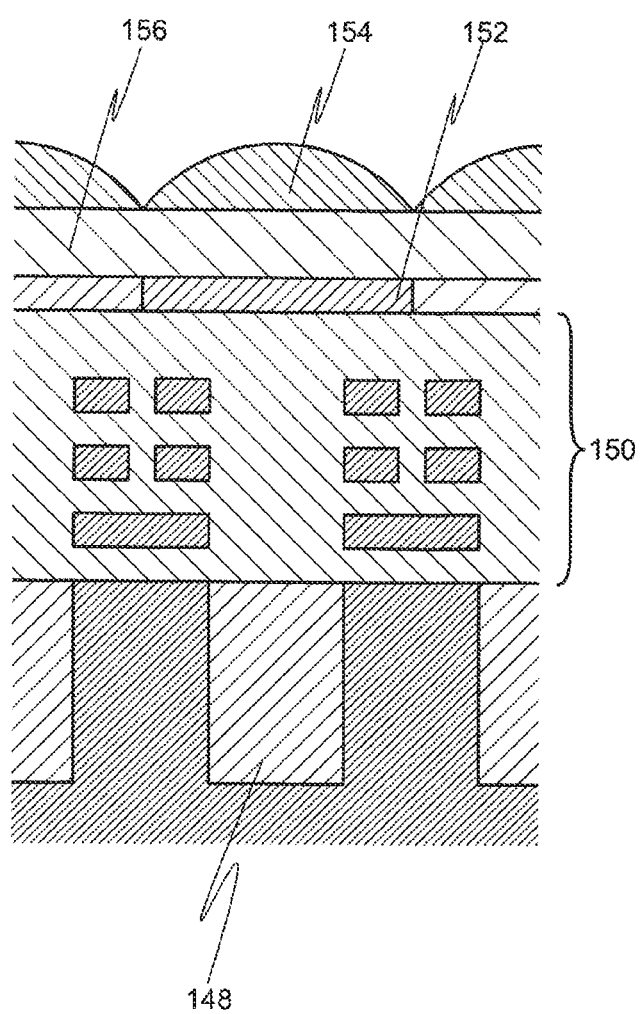
FIG. 6 is a cross-sectional view showing a CMOS image sensor in an embodiment according to the present disclosure.

In this embodiment, the CMOS image sensors are used as the photoelectric conversion elements. FIG. 6 is a cross-sectional view showing a structure of a CMOS image sensor in this embodiment.

The CMOS image sensor in this embodiment includes a photodiode 148, a wiring layer 150, a color filter 152, ad a microlens 154.

The photodiode 148 converts incident light into an electric charge. When light is incident on the photodiode 148, a part of the light generates an electron-hole pair in the vicinity of a PN junction in the photodiode 148. Before this step, a reverse bias is applied to the photodiode 148, so that information on the generated carrier pair is taken out as an electric current.

In this embodiment, the wiring layer 150 is located on a layer of the photodiode 148. The wiring layer 150 includes a wire and an element such as a transistor or the like that detect a signal of the carrier pair generated in the photodiode 148. Such a wire, element and the like are located at a position that is not just above the photodiode 148 in order to allow external light to be received by the photodiode 148 efficiently.

The color filter 152 selects a color of light to be incident on the photodiode 148. The plurality of CMOS image sensors each include the color filter 152 corresponding to any of at least three colors.

The microlens 154 is provided to collect the incident light at the photodiode 148 efficiently. In order to improve the efficiency of light collection, a flattening layer 156 may be provided below the microlens 154.

The CMOS image sensor located at the light receiving surface 104a of the image sensor 104 has been described so far.

The lens unit 106 is located to face the second surface 102b of the interposer substrate 102. The lens unit 106 includes the imaging lens group 120, a first case 122, a second case 124, the plurality of support columns 118, and an infrared filter 128.

The imaging lens group 120 may include a plurality of lenses. The imaging lens group 120 forms an image of light, provided from the imaging target and incident on the image sensor module 100, on the light receiving surface 104a of the image sensor 104.

The first case 122 has the imaging lens group 120 provided therein. In this embodiment, the first case 122 accommodates the imaging lens group 120. The first case 122 is cylindrical, and a side wall thereof supports a circumference of each of the lenses included in the imaging lens group 120. A coil 130 is wound around the first case 122. The coil 130 is provided to control the position of the imaging lens group 120. The electric current to be supplied to the coil 130 is controlled to control the position of the imaging lens group 120 by mutual action of a magnetic field induced by the electric current and the permanent magnets 140.

The second case 124 is joined with the first case 122. In this embodiment, the second case 124 is joined with the first case 122 via a plurality of springs 132, and accommodates the first case 122. With such a structure, the electric current to be supplied to the coil 130 is controlled to make the first case 122 swingable with respect to the second case 124. In this embodiment, the second case 124 is quadrangular prims-shaped. A transparent resin substrate 126 is used for a side surface of the second case 124 that faces the imaging lens group 120 in order to allow external light to enter the image sensor module 100.

The plurality of support columns 118 are provided in the second case 124. The plurality of support columns 118 are respectively inserted into the plurality of second throughholes 108B of the interposer substrate 102. With such a structure, the lens unit 106 is detachable from the second surface 102b of the interposer substrate 102.

The number of the support columns 118 is preferably three or greater in order to stably locate the lens unit 106 on the second surface 102b of the interposer substrate 102. The plurality of support columns 118 may be laid out in any manner in a plan view as long as the plurality of support columns 118 are not located on one straight line and do not overlap the plurality of photoelectric conversion elements located at the light receiving surface 104a of the image sensor 104. The support columns 118 need to be sufficiently strong to locate the lens unit 106 stably on the second surface 102b of the interposer substrate 102, and therefore, each need to have a sufficiently large diameter.

Among the plurality of support columns 118, two support columns 118 are connected with the coil 130. The two support columns 118 may be connected with both of two ends of the coil 130. The electric current to be supplied to the coil 130 via the two support columns 118 is controlled to control the position of the imaging lens group 120.

With such a structure, the support columns 118 may also act as wires connected with the coil 130, and thus the wiring structure is simplified.

The infrared filter 128 is a filter that absorbs light in an infrared region from light transmitted through the imaging lens group 120 and incident on the infrared filter 128. In this embodiment, the infrared filter 128 is included in the lens unit 106 and is located below the imaging lens group 120. The position of the infrared filter 128 is not limited to this. The infrared filter 128 may be located at any position as long as light from the imaging target passes the imaging lens group 120 and then passes the infrared filter 128. Alternatively, the infrared filter 128 may be secured to the first surface 102a of the interposer substrate 102.

The structure of the lens unit 106 included in the image sensor module 100 in this embodiment has been described so far. With such a structure, the image sensor module 100 in this embodiment allows the normal to the light receiving surface 104a of the image sensor 104 and the optical axis of the imaging lens group 120 included in the lens unit 106 to match each other with high precision.

In the case where the normal to the light receiving surface 104a of the image sensor 104 and the optical axis of the imaging lens group 120 do not match each other, even though, for example, an image of the imaging target is formed in a preferred manner at, or in the vicinity of, the center of an effective region of the light receiving surface 104a of the image sensor 104, a fault that the image is not formed in a preferred manner in a region far from the center, or the vicinity thereof, of the effective region of the light receiving surface 104a may occur.

The heat releasing member 134 is secured to a surface of the image sensor 104 that is opposite to the light receiving surface 104a.

The third case 136 has a recessed portion and is secured to the interposer substrate 102 while accommodating at least the image sensor 104 and the heat releasing member 134 located in the recessed portion.

The permanent magnets 140 are located outer to the second case 124 so as to surround the coil 130. In this embodiment, one permanent magnet 140 is located outer to each of four side surfaces of the second case 124. Such a layout of the permanent magnets 140 is an example, and the layout of the permanent magnets 140 is not limited to this.

The cover 138 accommodates the lens unit 106 and the permanent magnets 140. The cover 138 may be formed of a metal material, a ceramic material of the like.

The general structure of the image sensor module 100 in this embodiment has been described so far. According to the structure of the image sensor module 100 in this embodiment, the interposer substrate 102 also acts as a reference surface based on which the optical system is assembled. This allows the optical system to be assembled easily and highly precisely. Namely, the normal to the light receiving surface 104a of the image sensor 104 and the optical axis of the imaging lens group 120 included in the lens unit 106 are allowed to match each other easily and high precisely.

[Structure of the Interposer Substrate 102 and the Vicinity Thereof]

Figure 7:
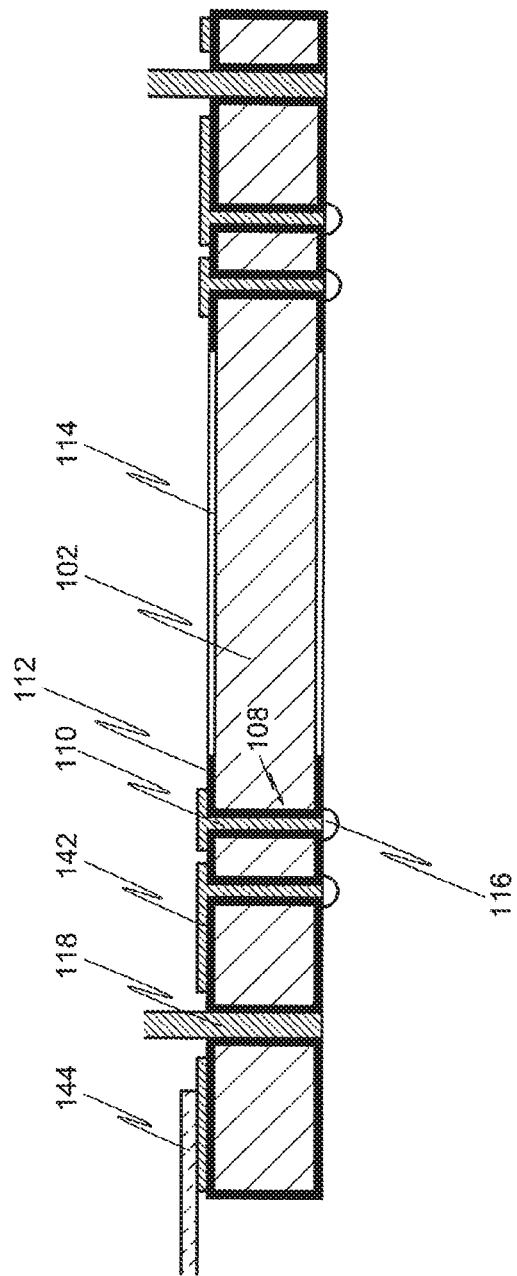
FIG. 7 is a cross-sectional view showing the interposer substrate and the vicinity thereof in the image sensor module in an embodiment according to the present disclosure.

Now, a structure of the interposer substrate 102 and the vicinity thereof in the image sensor module 100 in this embodiment will be described in detail. FIG. 7 is a cross-sectional view showing the structure of interposer substrate 102 and the vicinity thereof in the image sensor module 100 in this embodiment.

As in this embodiment, the image sensor module 100 may include a light absorption layer 112 on a part of the surfaces of the interposer substrate 102. In this embodiment, the light absorption layer 112 is provided on the surfaces of the interposer substrate 102, on a side surface of the interposer substrate 102, on a side wall of each of the plurality of through-holes 108, and on a region of the image sensor 104 other than the light receiving surface 104a. In other words, the light absorption layer 112 has an opening exposing the light receiving surface 104a of the image sensor 104 in order to allow the light reflected by the imaging target to be incident on the light receiving surface 104a of the image sensor 104.

The light absorption layer 112 is provided in order to suppress light entering the interposer substrate 102 from becoming astray as a result of being reflected by the electrodes or the like. Such stray light, if being incident on the image sensor 104, may undesirably appear in a captured image as flair. Therefore, it is preferred that the light absorption layer 112 is formed of a material that absorbs light entering the interposer substrate 102 and does not transmit or reflect such light.

The light absorption layer 112 may be formed of, for example, a metal material, a black resin or the like. Examples of the metal material include nickel (Ni), lead (Pb), gold (Au), copper (Cu), and the like. The black resin is formed of a black resin composition containing an appropriate combination of at least a photosensitive resin composition, a photoinitiator, a pigment and a solvent. The photosensitive resin composition may be a negative photosensitive resin composition. Examples of components that may be contained in the photosensitive resin composition include, for example, an acrylic monomer, an acrylic oligomer, an acrylic polymer, and the like. The pigment may be carbon black, titanium black such as titanium oxide, titanium oxide nitride or the like, a metal oxide such as iron oxide or the like, an organic pigment of a mixed color, or the like. The black resin may contain a non-photosensitive resin composition and a pigment dispersed therein. The non-photosensitive resin composition may be, for example, polyimide resin. The pigment may contain carbon black dispersed therein. Alternatively, the pigment may be aniline black, acetylene black, phthalocyanine black, titanium black or the like.

In each of the plurality of first through-holes 108A in the interposer substrate 102, a first through-electrode 110A is provided. Metal elements including such a plurality of first through-electrodes 110A, wires 142 located on both of the two surfaces of the interposer substrate 102 and the like are not located in contact with the interposer substrate 102, which is light-transmissive, but are located on the interposer substrate 102 with the light absorption layer 112 being provided between the metal elements and the interposer substrate 102.

As in this embodiment, the first through-electrodes 110A may be located to fill the first through-holes 108A. Alternatively, as described below in detail, the first through-electrodes 110A may be located only on the side walls of the first through-holes 108A to be hollow. Still alternatively, cavities of the hollow first through-electrodes 110A located only on the side walls of the first through-holes 108A may each be filled with an insulating material such as a resin or the like.

In each of the plurality of second through-holes 108B in the interposer substrate 102, a second through-electrode 110B may be provided. This is not absolutely necessary. The support columns 18 are inserted into the second through-holes 108B. Therefore, in the case of being provided in the second through-holes 108B, the second through-electrodes 110B are located only on side walls of the second through-holes 108A to be hollow.

On each of the two surfaces of the interposer substrate 102, a reflection preventive layer 114 may be provided in a region positionally corresponding to the image sensor 104. The reflection preventive layer 114 may be, for example, a sheet having a moth-eye structure, or the like. A "moth-eye structure" is a structure including a plurality of protrusions arrayed regularly on a surface. The cycle of the protrusions is, for example, 100 nm or greater and 300 nm or less. The protrusions preferably have a height smaller than the wavelength of visible light, and is, for example, 100 nm or greater and 300 nm or less. The sheet having such a moth-eye structure may be formed of, for example, a resin or the like. Such a structure allows the light from being reflected by the surfaces of the interposer substrate 102, and thus the image sensor 104 receives light efficiently.

In this embodiment, the image sensor 104 is connected with wires on the interposer substrate 102 via solder balls 116 located at ends of the plurality of through-electrodes 110 on the first surface 102a side. Namely, the image sensor 104 is flip-chip-connected with the interposer substrate 102.

The structure of the interposer substrate 102 and the vicinity thereof in the image sensor module 100 in this embodiment has been described so far. With such a structure, light entering the interposer substrate 102 is suppressed from becoming astray as a result of being reflected diffusely, and generation of flair caused by such stray light is suppressed. Without the light absorption layer 112, light entering the interposer substrate 102 may become astray as a result of being reflected diffusely by the metal material of the through-electrodes 110, the wires 142 and the like and flair may undesirably be caused.

[Method for Forming the Through-Holes 108, the Light Absorbing Layer 112 and the Through-Electrodes 110]

An example of method for forming the through-holes 108, the light absorbing layer 112, and the through-electrodes 110 in or on the interposer substrate 102 will be described.

First, a method for forming the through-holes 108 in the interposer substrate 102 will be described. The through-holes 108 may be formed by laser light irradiation, wet etching, dry etching or the like.

Usable for the laser light irradiation is an excimer laser light, an Nd:YAG laser (fundamental harmonic (wavelength: 1064 nm), second harmonic (wavelength: 532 nm), third harmonic (wavelength: 355 nm) or the like is usable), a femtosecond laser, or the like.

Usable for the wet etching is hydrogen fluoride (HF), sulfuric acid ($H_2SO_4$), nitric acid ($HNO_3$), hydrochloric acid (HCl), a mixture thereof, or the like. The laser light irradiation and the wet etching may be combined together appropriately. Specifically, a denatured layer may be formed by the laser light irradiation in a region in the interposer substrate 102 where the through-holes are to be formed, and the denatured layer is immersed in HF to be etched.

The dry etching may be performed by an RIE (Reactive Ion Etching) method using plasma, a DRIE (Deep RIE) method using a Bosch process, a sandblasting method, a laser process such as a laser ablation method or the like, etc.

The structure and method for producing the interposer substrate 102 in this embodiment has been described so far. Now, a method for forming the light absorption layer 112 will be described.

First, a method for forming the light absorption layer 112 of a metal material, among the above-described materials usable for the light absorption layer 112, will be described. The above-described region of the interposer substrate 102 on which the light absorption layer 112 is not to be formed is protected by a resist. Next, the interposer substrate 102 is divided into individual portions by dicing. Next, a catalyst is caused to adsorb to each individual portion of the interposer substrate 102 as a pre-process for electroless plating. Next, the individual portion of the interposer substrate 102 is immersed in a predetermined plating solution to form a metal film. Next, the resultant portion is immersed in a resist removing solution and washed with flowing water. In this manner, the light absorption layer 112 is formed by use of a light-blocking metal material.

Next, a method for forming the light absorption layer 112 of a black resin, among the above-described materials usable for the light absorption layer 112, will be described. A protective layer of a film resist or the like is formed on the above-described region of the interposer substrate 102 on which the light absorption layer 112 is not to be formed. Next, the interposer substrate 102 is divided into individual portions by dicing. Next, each individual portion of the interposer substrate 102 is immersed in the black resin to color the individual portion black. Next, the individual portion is immersed in a removing solution to remove the protective layer. In this manner, the light absorption layer 112 is formed of a black resin.

The method for forming the light absorption layer 112 has been described. Now, a method for forming the through-electrodes 110 will be described.

The through-electrodes 110 may be formed by, for example, filling plating, sputtering or vapor deposition, conformal plating, or the like. With reference to FIG. 8A to FIG. 11B, the through-electrodes 110 formed by such methods will be described. FIG. 8A, FIG. 9A, FIG. 10A and FIG. 11A are cross-sectional views of the through-electrodes 110 formed by the above-listed methods. FIG. 8B, FIG. 9B, FIG. 10B and FIG. 11B are plan views of the through-electrodes 110 formed by the above-listed methods.

Figure 8A:
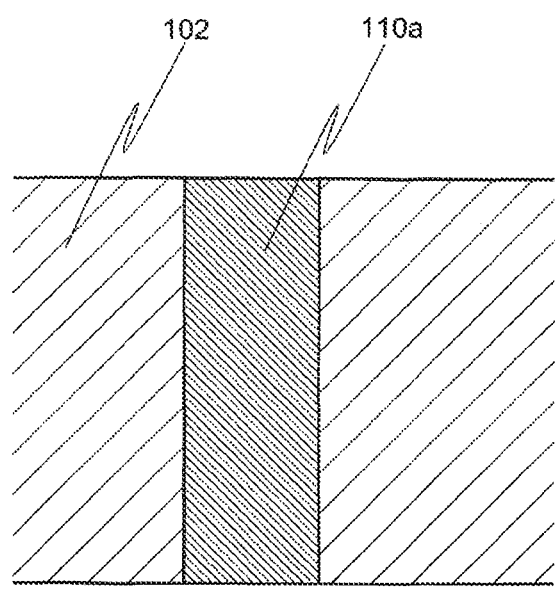
FIG. 8A is a cross-sectional view showing a structure of a through-electrode in an embodiment according to the present disclosure.
Figure 8B:
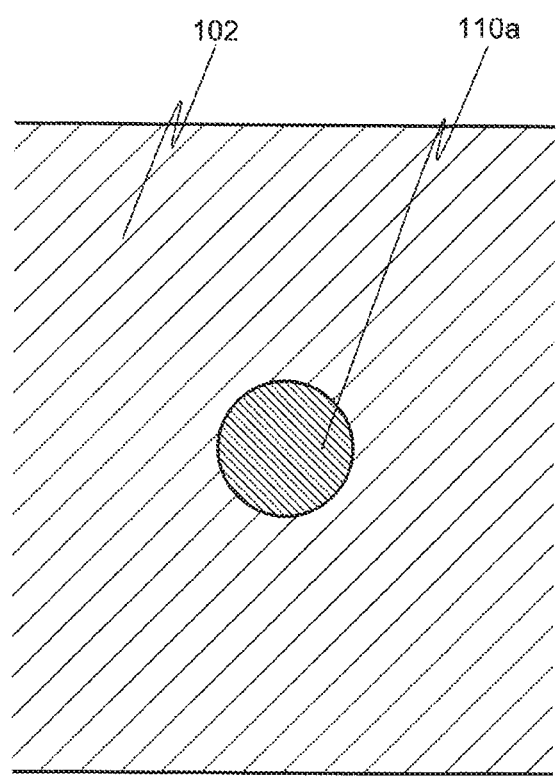
FIG. 8B is a plan view showing the structure of the through-electrode in an embodiment according to the present disclosure.

FIG. 8A and FIG. 8B are respectively a cross-sectional view and a plan view of a through-electrode 110a formed by filling plating. Filling plating is performed as follows. A metal layer acting as a seed layer is grown from one surface of the interposer substrate 102 having the through-hole 108 formed therein, and a plating layer is grown on the metal layer by electrolytic plating to close one opening end of the through-hole 108 (to form a plating lid). The plating layer is grown to fill the through-hole 108 by electrolytic plating using the plating lid as a seed layer.

Figure 9A:
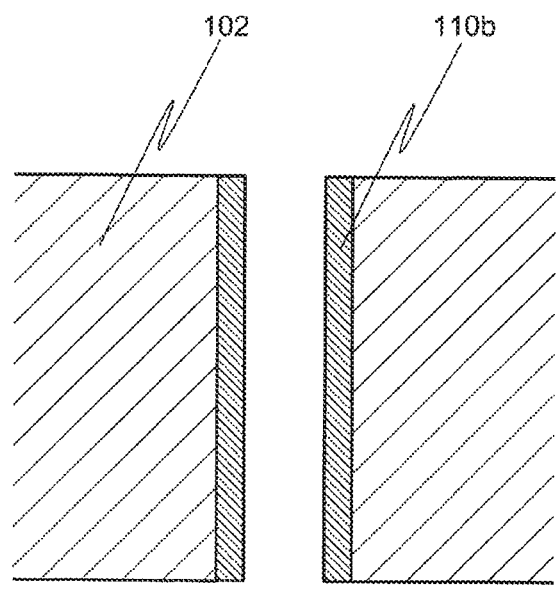
FIG. 9A is a cross-sectional view showing a structure of a through-electrode in an embodiment according to the present disclosure.
Figure 9B:
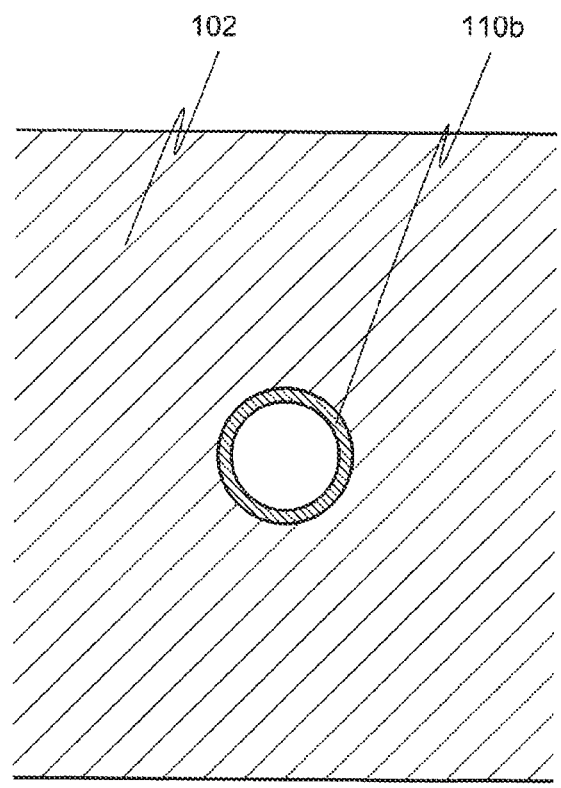
FIG. 9B is a plan view showing the structure of the through-electrode in an embodiment according to the present disclosure.

FIG. 9A and FIG. 9B are respectively a cross-sectional view and a plan view of a through-electrode 110b formed by sputtering or vapor deposition. As shown in FIG. 9A and FIG. 9B, the through-electrode 110b are formed on the side wall of the through-hole 108, and each have a cavity therein. With sputtering or vapor deposition, a metal layer may be formed on the side wall of the through-hole 108. Such a process is performed on both of two surfaces of the interposer substrate 102, so that the through-electrode 110b is formed in the through-hole 108 having a large aspect ratio, unlike in the case where such a process is performed on one of the surfaces of the interposer substrate 102. Alternatively, the metal layer may be formed on the side wall of the through-hole 108 by electroless plating.

Figure 10A:
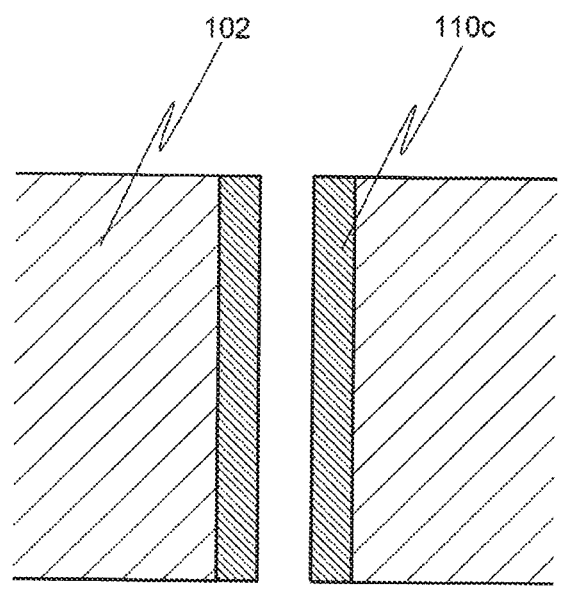
FIG. 10A is a cross-sectional view showing a structure of a through-electrode in an embodiment according to the present disclosure.
Figure 10B:
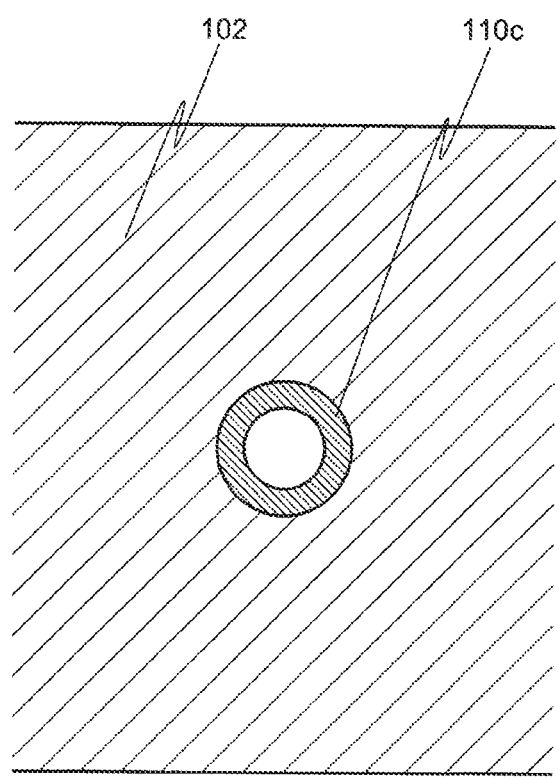
FIG. 10B is a plan view showing the structure of the through-electrode in an embodiment according to the present disclosure.

FIG. 10A and FIG. 10B are respectively a cross-sectional view and a plan view of a through-electrode 110c formed by conformal plating. As shown in FIG. 10A and FIG. 10B, the through-electrode 110c has a cavity therein like the through-electrode 110b. Conformal plating is performed as follows. The metal layer formed on the side wall of the through-hole 108 by sputtering, vapor deposition or electroless plating is used as a seed layer to grow a plated layer on the seed layer by electrolytic plating, such that the plated layer has a cavity therein.

Figure 11A:
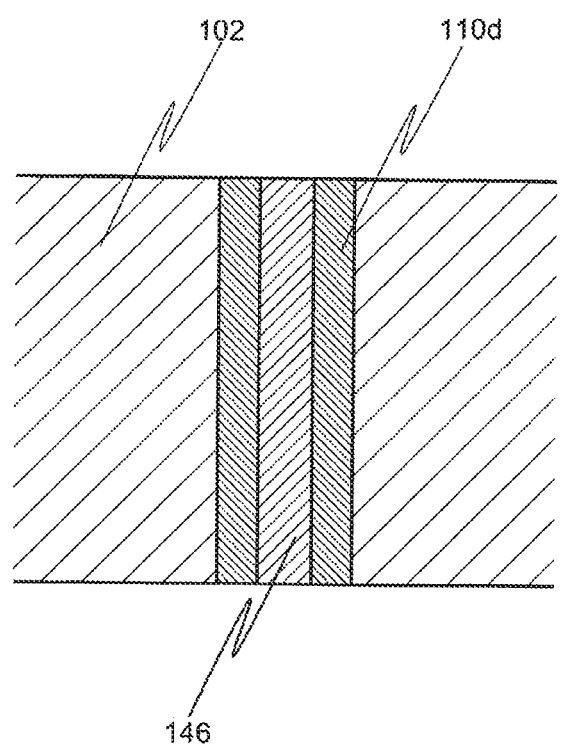
FIG. 11A is a cross-sectional view showing a structure of a through-electrode in an embodiment according to the present disclosure.
Figure 11B:
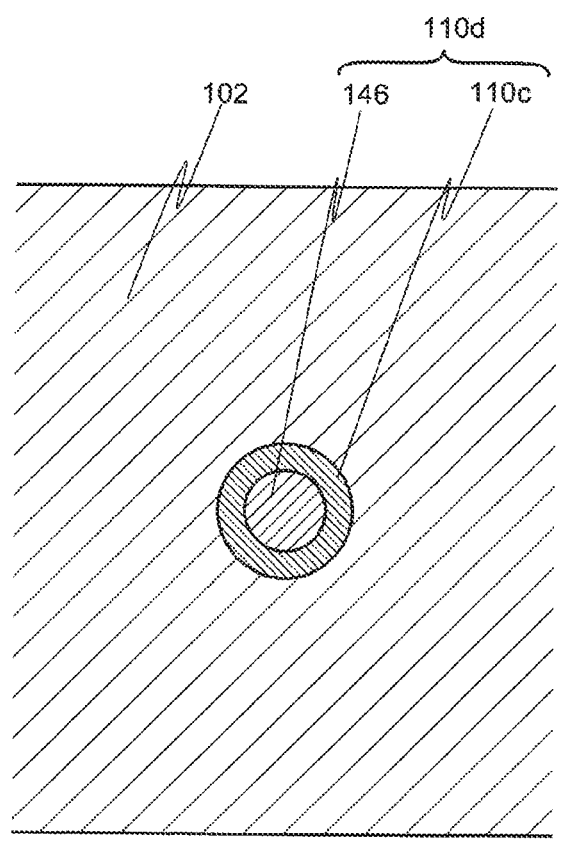
FIG. 11B is a plan view showing the structure of the through-electrode in an embodiment according to the present disclosure.

The through-electrode 110c formed by conformal plating has a cavity inside the through-hole 108. Therefore, the through-hole 108 may be filled with a resin or the like. FIG. 11A and FIG. 11B are respectively a cross-sectional view and a plan view of a through-electrode 110d formed by filing the cavity of the through-electrode 110c, formed by conformal plating, with a resin 146.

The image sensor module 100 in this embodiment has been described so far. In the image sensor module 100 in this embodiment, the image sensor 104 and the lens unit 106 are both located by use of the interposer substrate 102 as a reference plane for attachment.

The image sensor module 100 in this embodiment has the above-described structure, and thus allows the normal to the light receiving surface 104a of the image sensor 104 and the optical axis of the imaging lens group 120 to match each other easily and highly precisely. Therefore, an image of the imaging target is controlled to be formed uniformly in the entirety of the effective region of the light receiving surface 104a of the image sensor 104.

In the case where the normal to the light receiving surface 104a of the image sensor 104 and the optical axis of the imaging lens group 120 do not match each other, even though, for example, an image of the imaging target is formed in a preferred manner at, or in the vicinity of, the center of the effective region of the light receiving surface 104a of the image sensor 104, a fault that the image is not formed in a preferred manner in a region far from the center, or the vicinity thereof, of the effective region of the light receiving surface 104a may occur.

Embodiment 2

Figure 12:
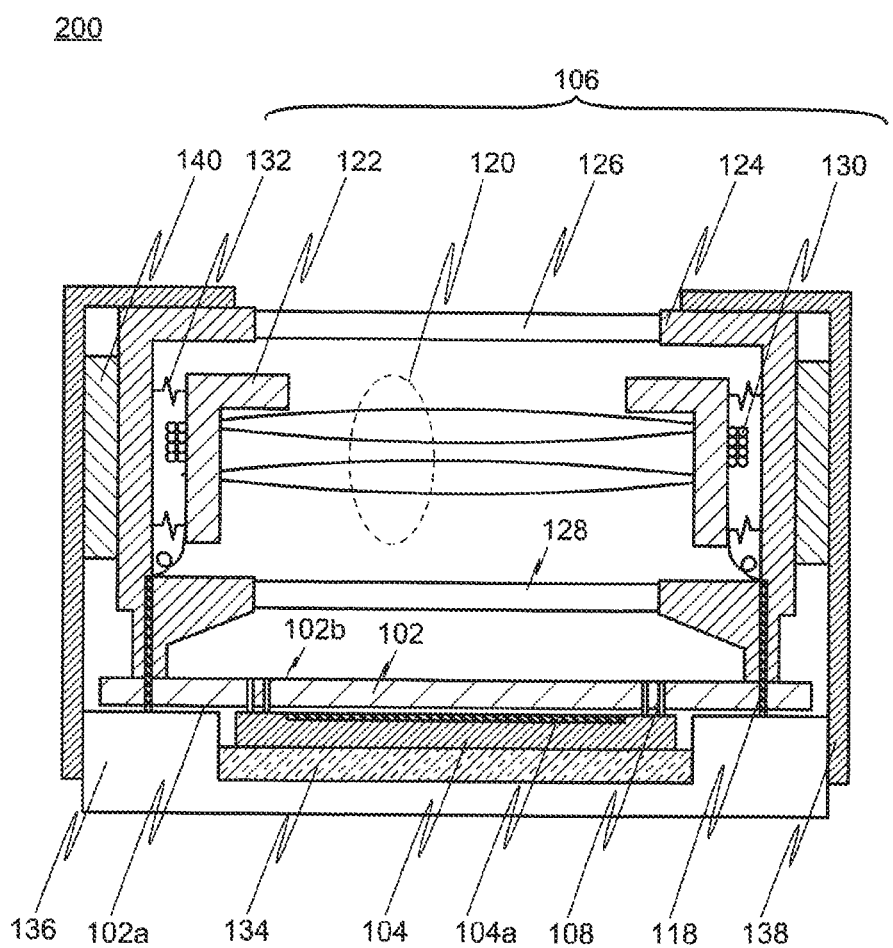
FIG. 12 is a cross-sectional view showing a structure of an image sensor module in an embodiment according to the present disclosure.
Figure 13:
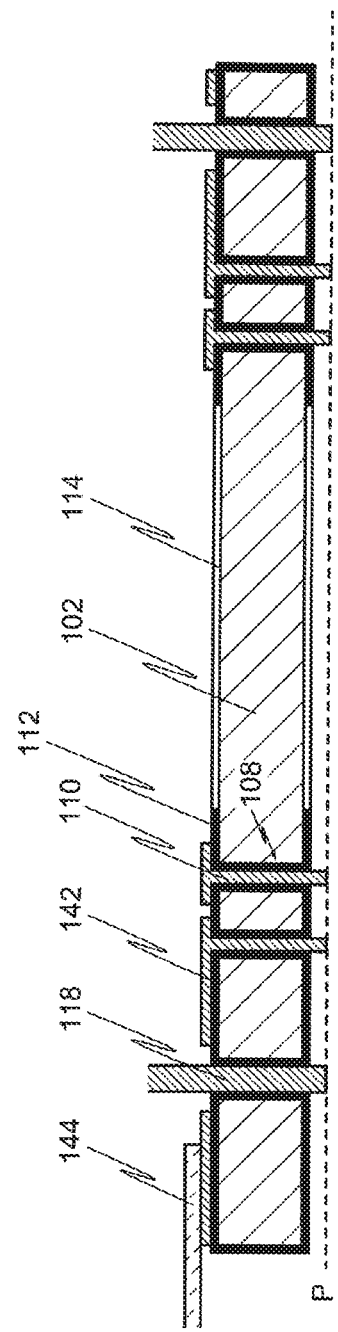
FIG. 13 is a cross-sectional view showing an interposer substrate and the vicinity thereof in the image sensor module in an embodiment according to the present disclosure.

With reference to FIG. 12 and FIG. 13, a structure of an image sensor module 200 in this embodiment will be described in detail. FIG. 12 is a cross-sectional view showing the structure of the image sensor module 200 in this embodiment. The image sensor module 200 in this embodiment is different from the image sensor module 100 in embodiment 1 in the structure of the interposer substrate 102 and the vicinity thereof. FIG. 13 is a cross-sectional view showing a structure of the interposer substrate 102 and the vicinity thereof in the image sensor module 200 in this embodiment.

In the image sensor module 200 in this embodiment, an end, on the first surface 102a side, of each of the first through-electrodes 110A provided in the plurality of through-holes 108A is located on the image sensor 104 side with respect to the first surface 102a. In other words, the end, on the first surface 102a side, of each first through-electrode 110A in the through-hole 108A protrudes from the interposer substrate 102.

In FIG. 13, dashed line P represents a plane parallel to the second surface 102b of the interposer substrate 102. The ends, on the first surface 102a side, of the plurality of first through-electrodes 110A are located on dashed line P. Namely, the ends, on the first surface 102a side, of the plurality of first through-electrodes 110A are located on a plane parallel to the second surface 102b of the interposer substrate 102.

In other words, the interposer substrate 102 and the image sensor 104, which are flip-chip-connected with each other, are connected only by the plurality of first through-electrodes 110A, which are protruding, and the first surface 102a of the interposer substrate 102 and the image sensor 104 do not contact each other.

With such a structure, the image sensor 104 and the interposer substrate 102 are located parallel to each other highly precisely, and the positional alignment of the image sensor 104 and the interposer substrate 102 during the production process is made easy.

In the case where planes are to be connected with each other, if an air layer or the like is made between the planes in, for example, a connection step, it is made difficult to perform control for positional alignment. This may undesirably decrease the yield.

An example of method for forming the through-electrodes 110 in the image sensor module 200 in this embodiment will be described. First, the light absorption layer 112 is formed on at least the side walls of the through-holes 108A and 108B by the method described above. It is desirable that the through-holes 108 are filled with the through-electrodes 110 to the opening ends, so that the interposer substrate 102 having the through-electrodes 110 formed therein is as flat as possible. Next, the through-electrodes 110 are protected at only the first surface 102a of the interposer substrate 102, and only the interposer substrate 102 is thinned by etching.

As a result, the through-electrodes 110 in the image sensor module 200 in this embodiment are formed. In this manner, the degree of flatness of the first surface 102a of the interposer substrate 102 is decreased, but the ends of the plurality of through-electrodes 110, which connect the interposer substrate 102 and the image sensor 104 to each other, are guaranteed to be present on the same plane. This method does not require the solder balls 116 for flip-chip connection. This method does not require patterning using a photomask or the like, and the through-electrodes 110 are formed in a self-aligned manner. This simplifies the production process.

Embodiment 3

Figure 14:
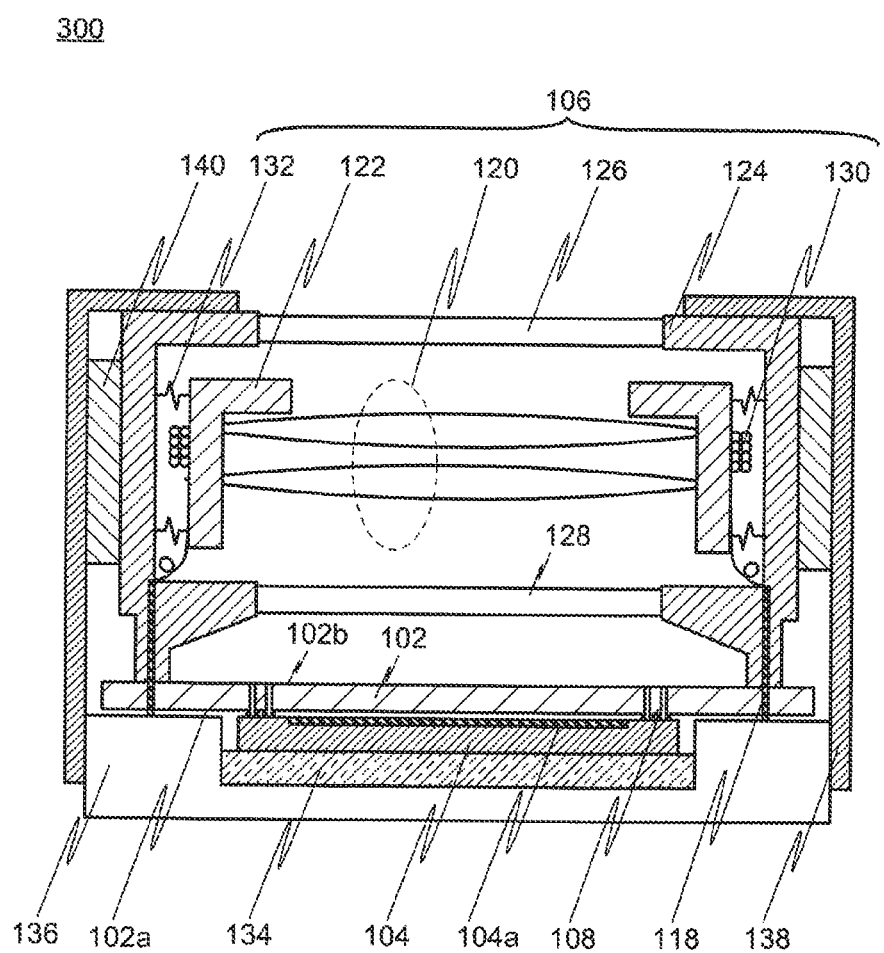
FIG. 14 is a cross-sectional view showing a structure of an image sensor module in an embodiment according to the present disclosure.
Figure 16A:
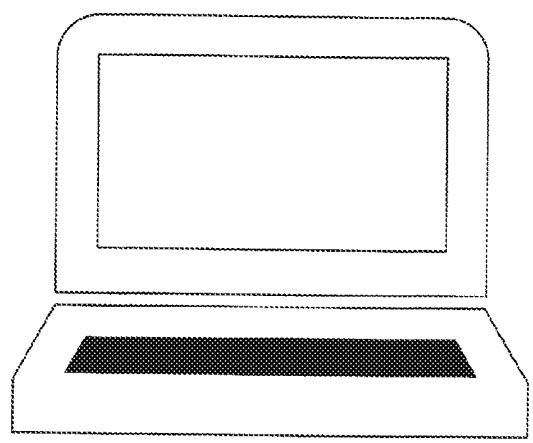
FIG. 16A shows an example of application item on which an image sensor module in an embodiment according to the present disclosure is mountable.
Figure 16B:
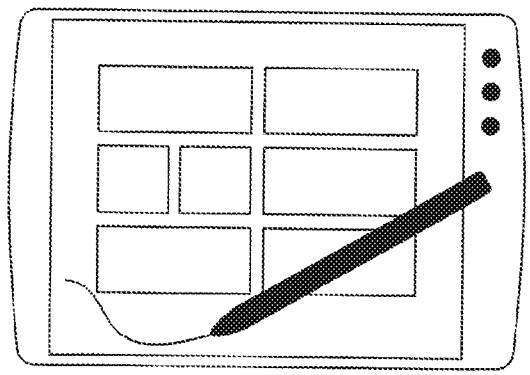
FIG. 16B shows an example of application item on which an image sensor module in an embodiment according to the present disclosure is mountable.
Figure 16C:
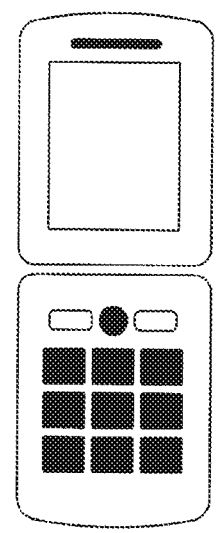
FIG. 16C shows an example of application item on which an image sensor module in an embodiment according to the present disclosure is mountable.
Figure 16D:
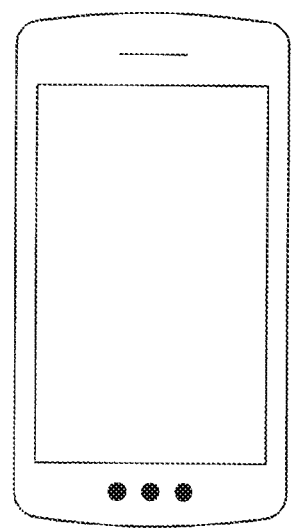
FIG. 16D shows an example of application item on which an image sensor module in an embodiment according to the present disclosure is mountable.
Figure 16E:
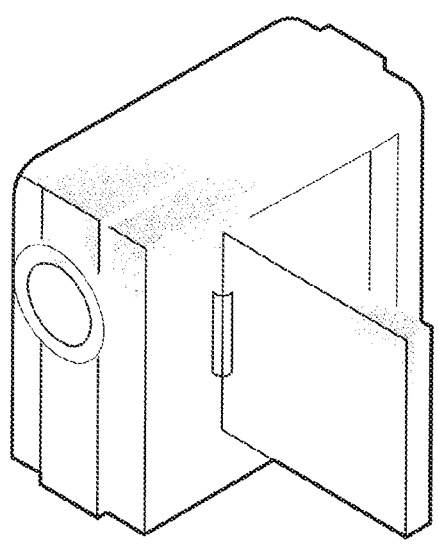
FIG. 16E shows an example of application item on which an image sensor module in an embodiment according to the present disclosure is mountable.
Figure 16F:
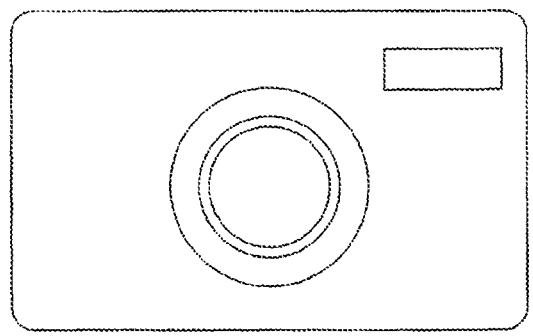
FIG. 16F shows an example of application item on which an image sensor module in an embodiment according to the present disclosure is mountable.
Figure 17A:
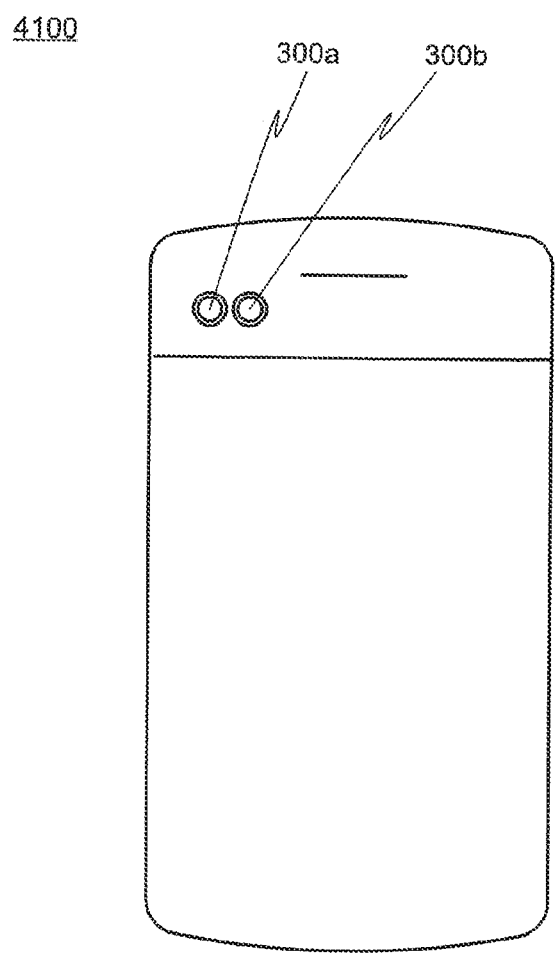
FIG. 17A shows an example of application item on which an image sensor module in an embodiment according to the present disclosure is mountable.
Figure 17B:
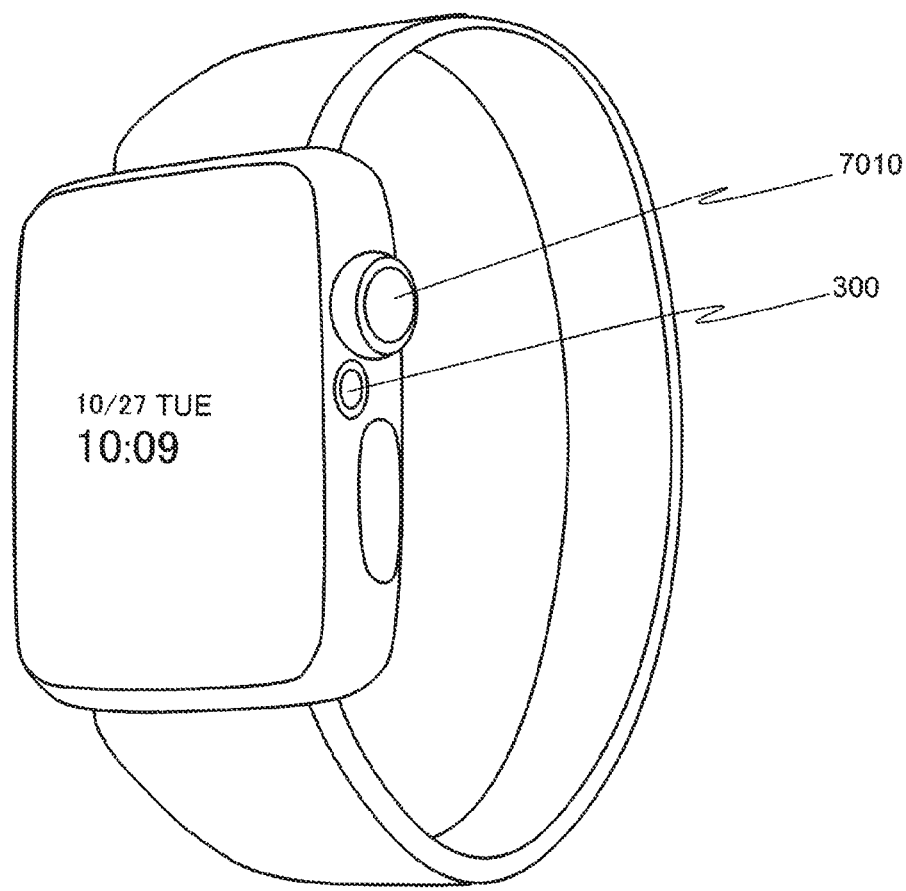
FIG. 17B shows an example of application item on which an image sensor module in an embodiment according to the present disclosure is mountable.
Figure 17C:
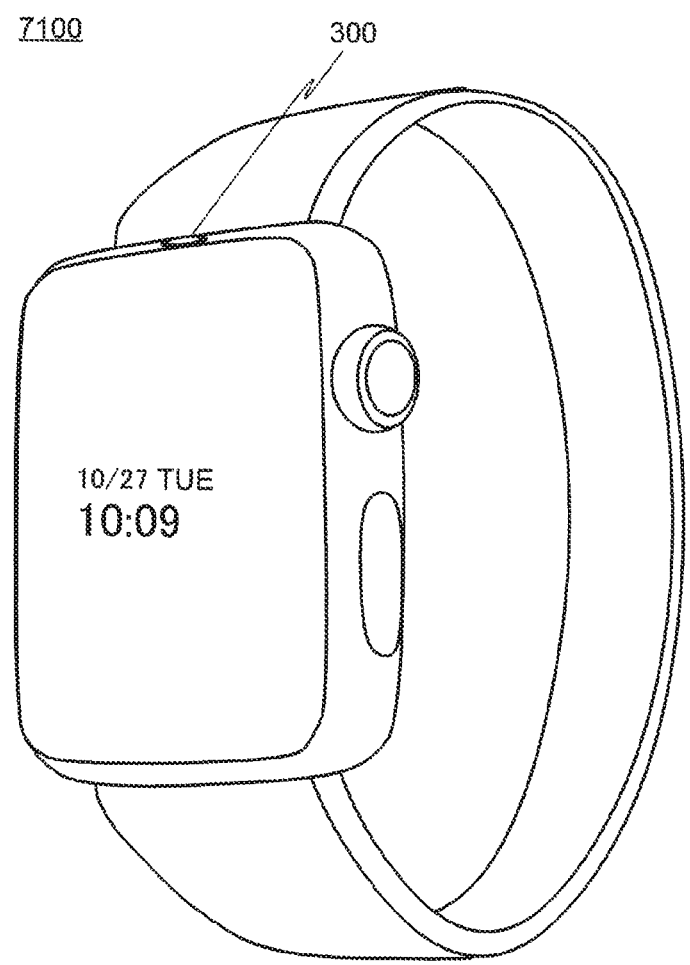
FIG. 17C shows an example of application item on which an image sensor module in an embodiment according to the present disclosure is mountable.
Figure 17D:
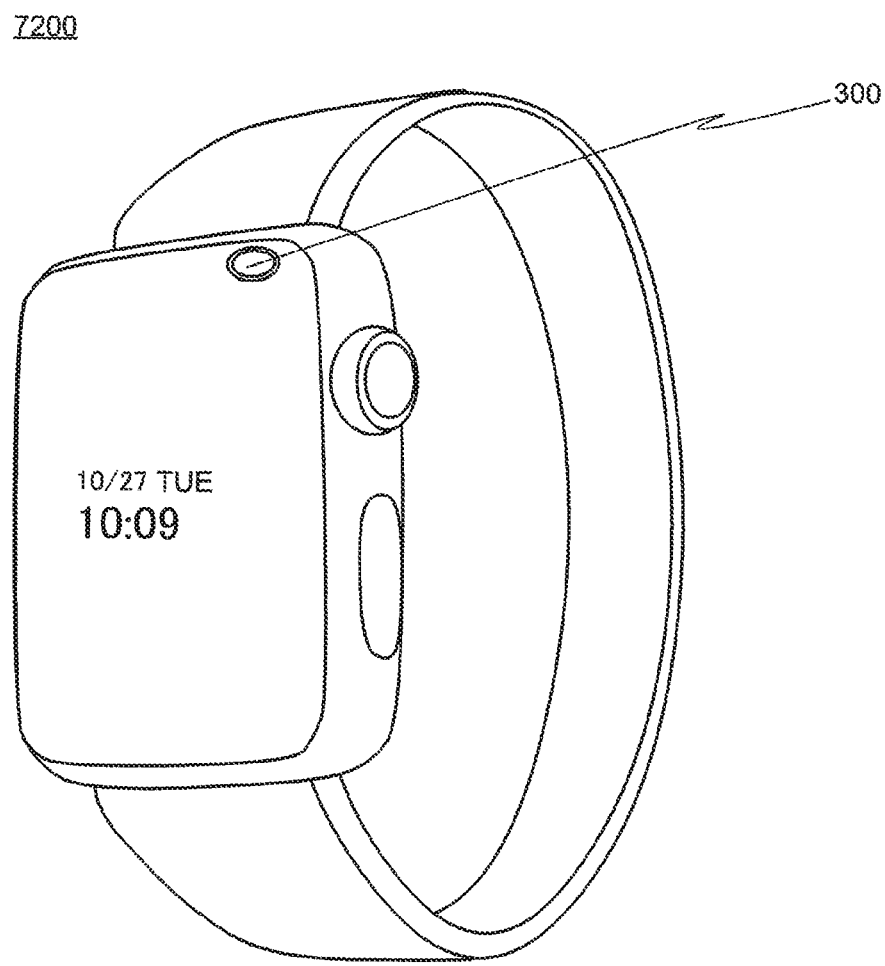
FIG. 17D shows an example of application item on which an image sensor module in an embodiment according to the present disclosure is mountable.
Figure 17E:
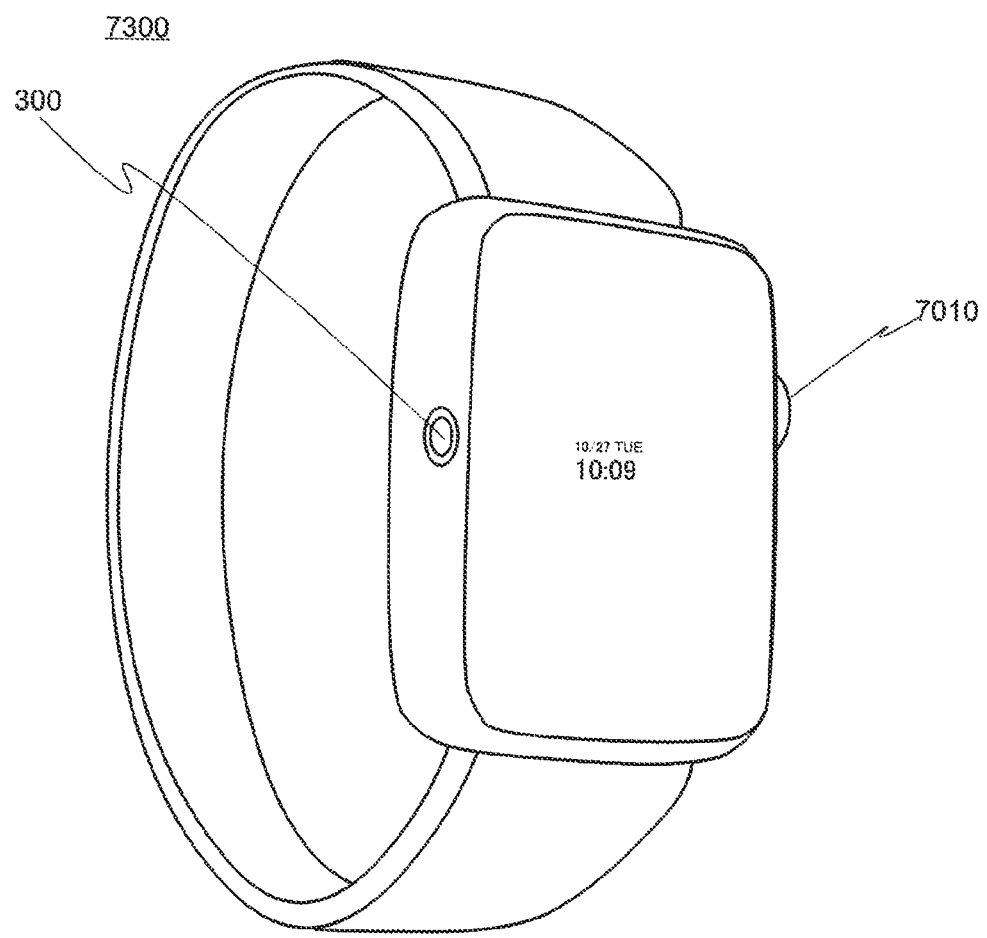
FIG. 17E shows an example of application item on which an image sensor module in an embodiment according to the present disclosure is mountable.

With reference to FIG. 14 and FIG. 15, a structure of an image sensor module 300 in this embodiment will be described in detail. FIG. 14 is a cross-sectional view showing the structure of the image sensor module 300 in this embodiment. The image sensor module 300 in this embodiment is different from the image sensor module 200 in embodiment 2 in the structure of the interposer substrate 102 and the vicinity thereof. FIG. 15 is a cross-sectional view showing a structure of the interposer substrate 102 and the vicinity thereof in the image sensor module 300 in this embodiment.

Unlike the image sensor module 200 in embodiment 2, the image sensor module 300 in this embodiment includes a protruding portion surrounding the side wall of each of the plurality of first through-electrodes 110A on the first surface 102a side of the interposer substrate 102.

In FIG. 15, dashed line P represents a plane parallel to the second surface 102b of the interposer substrate 102. The ends, on the first surface 102a side, of the plurality of first through-electrodes 110A are located on dashed line P. Namely, the ends, on the first surface 102a side, of the plurality of first through-electrodes 110A are located on a plane parallel to the second surface 102b of the interposer substrate 102.

In other words, the interposer substrate 102 and the image sensor 104, which are flip-chip-connected with each other, are connected only by the plurality of first through-electrodes 110A, which are protruding, and the first surface 102a of the interposer substrate 102 and the image sensor 104 do not contact each other.

With such a structure, the image sensor 104 and the interposer substrate 102 are located parallel to each other highly precisely, and the positional alignment of the image sensor 104 and the interposer substrate 102 during the production process is made easy. In addition, the side walls of the through-electrodes 110 are protected by the interposer substrate 102. Therefore, the mechanical strength of the interposer substrate 102 having the through-electrodes 110 formed therein is improved.

In the case where planes are to be connected with each other, if an air layer or the like is made between the planes in, for example, a connection step, it is made difficult to perform control for positional alignment. This may undesirably decrease the yield.

An example of method for forming the through-electrodes 110 in the image sensor module 300 in this embodiment will be described. First, the light absorption layer 112 is formed on at least the side walls of the through-holes 108A and 108B by the method described above. It is desirable that the through-holes 108 are filled with the through-electrodes 110 to the opening ends, so that the interposer substrate 102 having the through-electrodes 110 formed therein is as flat as possible. Next, a resist is formed on the first surface 102a of the interposer substrate 102 to protect the through-electrodes 110 and the vicinity thereof, and the interposer substrate 102 is thinned by etching.

As a result, the through-electrodes 110 in the image sensor module 300 in this embodiment are formed. In this manner, the degree of flatness of the first surface 102a of the interposer substrate 102 is decreased, but the ends of the plurality of through-electrodes 110, which connect the interposer substrate 102 and the image sensor 104 to each other, are guaranteed to be present on the same plane. Regions of the interposer substrate 102 that are protected without being etched away in the vicinity of the through-holes 108 are present on the same plane. This method does not require the solder balls 116 for flip-chip connection. In addition, the side walls of the through-electrodes 110 are protected by the interposer substrate 102. Therefore, the mechanical strength of the interposer substrate 102 having the through-electrodes 110 formed therein is improved.

OTHER EMBODIMENTS

FIG. 16A to FIG. 16F and FIG. 17A to FIG. 17E show application items on which an image sensor module in an embodiment according to this disclosure is mountable. The image sensor modules 100 to 300 produced as described above are mountable on any of various application items. The image sensor modules 100 to 300 may each be mounted on, for example, a notebook personal computer 1000, a tablet terminal 2000, a mobile phone 3000, a smartphone 4000, a digital video camera 5000, a digital camera 6000 or the like. Image sensor modules 300a and 300b in an embodiment according to the present disclosure may be used for a dual camera and thus mounted on a smartphone 4100 or the like. In this example, the dual camera is mounted on a rear surface of the smartphone 4100. A conventional smartphone-mountable camera including one imaging element has a problem of having a very large depth of field due to the restriction on the size of the imaging element. In the case where a dual camera including two imaging elements is mounted on a smartphone, images captured under two different conditions may be synthesized later, so that the depth of field may be adjusted to be equivalent to that of, for example, a single-lens reflex camera. The number of the image sensor modules 300a and 300b is not limited to two and may be three or more. The plurality of image sensor modules are not limited to being arranged on one lateral line as in the smartphone 4100 in the figure, but may be arranged on one vertical line or arranged irregularly. There is no limitation on the distance between the plurality of image sensor modules. The plurality of image sensor modules may be located in the vicinity of two side surfaces of the smartphone, or in the vicinity of diagonal corners. The image sensor module 300 in an embodiment according to the present disclosure may be mounted on a wrist watch. A wrist watch 7000 has the image sensor module 300 mounted on the vicinity of a winding crown 7010. A wrist watch 7100 has the image sensor module 300 mounted on a band (in the vicinity of 12:00 o'clock). A wrist watch 7200 has the image sensor module 300 mounted on a display panel. As in a wrist watch 7300, the image sensor module 300 may be mounted oppositely to the wrist watch 7000, namely, on a side surface opposite to the side surface on which the winding crown 7010 is located.

The present disclosure is not limited to any of the above-described embodiments. The above embodiments may be modified appropriately without departing from the gist of the present disclosure.

The present disclosure provides a structure of an image sensor module allowing an optical system to be assembled easily and highly precisely.

What is claimed is:

1. A through-hole electrode substrate comprising a glass substrate having a first surface and a second surface opposite to the first surface, the glass substrate being light-transmissive and having a plurality of first through-holes penetrating from the first surface to the second surface, the plurality of first through-holes being provided outside of a rectangular region so as to surround the rectangular region,
    wherein
    the rectangular region has a first side, a second side, a third side opposite to the first side and a fourth side opposite to the second side,
    the first side and the third side extend in a first direction,
    the second side and the fourth side extend in a second direction,
    the glass substrate has four sides including a fifth side that extends in the first direction and is located closer to the first side than to the third side, and
    a part of the plurality of first through-holes are located between the first side and the fifth side in a planar view, and in a zigzag line extending along the first side.

2. The through-hole electrode substrate according to claim 1, wherein the plurality of first through-holes are provided along each of four sides of the rectangular region.

3. The through-hole electrode substrate according to claim 1, wherein
    the four sides of the glass substrate include a sixth side that extends in the second direction and is located closer to the second side than to the fourth side, and another part of the first through-holes are located between the second side and the sixth side in the planar view, and in another zigzag line extending along the second side.

4. A through-hole electrode substrate comprising a glass substrate having a first surface and a second surface opposite to the first surface, the glass substrate being light-transmissive and having a plurality of first through-holes penetrating from the first surface to the second surface, the plurality of first through-holes being provided outside of a rectangular region so as to surround the rectangular region,
    wherein the glass substrate has a plurality of second through-holes penetrating from the first surface to the second surface in an edge part of the glass substrate, a diameter of each of the plurality of second through-holes being larger than a diameter of each of the plurality of first through-holes.

5. The through-hole electrode substrate according to claim 4, wherein
    the glass substrate has a rectangular-shape, and
    the plurality of second through-holes are arranged in four edge parts of the glass substrate.

6. The through-hole electrode substrate according to claim 5, further comprising a through electrode provided in at least one of the plurality of first through-holes, the through electrode connected to a first wiring on the first surface,
    wherein the through electrode is not provided in the plurality of second through-holes.

7. The through-hole electrode substrate according to claim 6, further comprising a light absorption layer provided between an inner-wall of the at least one of the plurality of first through-holes and the through electrode.

8. The through-hole electrode substrate according to claim 7, wherein the light absorption layer is provided on an inner-wall of the at least one of the plurality of second through-holes.

9. The through-hole electrode substrate according to claim 8, wherein the light absorption layer is provided on a side surface of the glass substrate.

10. The through-hole electrode substrate according to claim 7, wherein the light absorption layer includes a black resin.

11. The through-hole electrode substrate according to claim 7, wherein
    the light absorption layer includes a metal,
    the light absorption layer is provided between the first surface and the first wiring,
    a part of the light absorption layer is exposed from the first wiring, and
    the light absorption layer is electrically separated from the first wiring.

12. The through-hole electrode substrate according to claim 1, further comprising:
    a through electrode provided in at least one of the plurality of first through-holes, the through electrode connected to a first wiring on the first surface; and
    a light absorption layer provided between an inner-wall of the at least one of the plurality of first through-holes and the through electrode, the light absorption layer including a black resin.

13. The through-hole electrode substrate according to claim 1, further comprising:
    a through electrode provided in at least one of the plurality of first through-holes, the through electrode connected to a first wiring on the first surface; and a light absorption layer provided between the first surface and the first wiring, the light absorption layer including a metal;
wherein a part of the light absorption layer is exposed from the first wiring, and
the light absorption layer is electrically separated from the first wiring.

14. A through-hole electrode substrate comprising a glass substrate having a first surface and a second surface opposite to the first surface, the glass substrate being light-transmissive and having a plurality of first through-holes penetrating from the first surface to the second surface, the plurality of first through-holes being provided outside of a rectangular region so as to surround the rectangular region,
wherein
a length of a first side of the rectangular region in a first direction is at least 19 times of a size of one of the plurality of the first through-holes in the first direction in a planar view, and
a length of a second side of the rectangular region in a second direction is at least 11 times of a size of one of the plurality of the first through-holes in the second direction in the planar view.

15. The through-hole electrode substrate according to claim 14, wherein at least a part of the plurality of first through-holes overlaps with a lens in the planar view.

16. The through-hole electrode substrate according to claim 14, wherein the plurality of first through-holes surround a light receiving surface.

* * * * *